(12) United States Patent
Yang

(10) Patent No.: US 12,272,896 B2
(45) Date of Patent: Apr. 8, 2025

(54) CONNECTOR ASSEMBLY WITH MOVABLE HEAT SINK

(71) Applicant: Molex, LLC, Lisle, IL (US)

(72) Inventor: Che-Yuan Yang, New Taipei (TW)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 18/242,557

(22) Filed: Sep. 6, 2023

(65) Prior Publication Data

US 2023/0411897 A1    Dec. 21, 2023

Related U.S. Application Data

(63) Continuation of application No. 17/547,236, filed on Dec. 10, 2021, now Pat. No. 11,784,434.

(30) Foreign Application Priority Data

Dec. 10, 2020 (CN) .......................... 202011456509.9

(51) Int. Cl.
*H01R 13/502* (2006.01)
*F16B 2/18* (2006.01)
(Continued)

(52) U.S. Cl.
CPC ........... *H01R 13/5025* (2013.01); *F16B 2/18* (2013.01); *F16B 2/185* (2013.01); *F16B 2/205* (2013.01);
(Continued)

(58) Field of Classification Search
CPC .............. H01R 13/5025; H01R 13/659; H01R 13/6591; H01R 13/6583; H01R 13/6594;
(Continued)

(56) References Cited

U.S. PATENT DOCUMENTS 7,539,018 B2    5/2009    Murr et al.
7,892,013 B1    2/2011    Piekos et al.
(Continued)

FOREIGN PATENT DOCUMENTS

TW          M596469 U        6/2020
WO        2020086823 A1      4/2020
WO    WO-2020238575 A1 * 12/2020 ........... G02B 6/4201

OTHER PUBLICATIONS

Ex Parte Quayle action received for U.S. Appl. No. 17/547,236 mailed Mar. 16, 2023, 9 pages.
(Continued)

*Primary Examiner* — Justin M Kratt

(57) ABSTRACT

An example connector assembly includes a guide shielding cage with a cage body and an upper heat sink bracket. The cage body includes upper window. A lower wall of the upper heat sink bracket is formed with a window corresponding to the upper window. The connector assembly also includes an upper heat sink module including a heat dissipating member. The heat dissipating member is capable of moving between a releasing position which is higher and an acting position which is lower relative to the upper insertion space. The cage body further includes fixing pieces positioned at two sides of the top wall and extend upwardly. The lower wall of the upper heat sink bracket engages with the fixing pieces of the cage body, and the upper heat sink bracket further comprises a latching piece which extends from the lower wall and latches into the top wall of the cage body.

20 Claims, 14 Drawing Sheets

(51) Int. Cl.
*F16B 2/20* (2006.01)
*H01L 23/40* (2006.01)
*H01R 13/659* (2011.01)
*H01R 13/6591* (2011.01)
*H05K 7/20* (2006.01)
*F16B 2/22* (2006.01)
*F16B 2/24* (2006.01)
*F28F 9/26* (2006.01)
*G02B 6/42* (2006.01)
*H01R 13/6583* (2011.01)
*H01R 13/6594* (2011.01)

(52) U.S. Cl.
CPC ............ *H01L 23/40* (2013.01); *H01R 13/659* (2013.01); *H01R 13/6591* (2013.01); *H05K 7/2039* (2013.01); *H05K 7/20436* (2013.01); *H05K 7/2049* (2013.01); *F16B 2/20* (2013.01); *F16B 2/22* (2013.01); *F16B 2/24* (2013.01); *F16B 2/241* (2013.01); *F28F 9/262* (2013.01); *G02B 6/4269* (2013.01); *H01L 23/4093* (2013.01); *H01R 13/6583* (2013.01); *H01R 13/6594* (2013.01); *H05K 7/20* (2013.01); *H05K 7/20409* (2013.01); *H05K 7/20418* (2013.01)

(58) Field of Classification Search
CPC .. F16B 2/18; F16B 2/185; F16B 2/205; F16B 2/20; F16B 2/22; F16B 2/24; F16B 2/241; H01L 23/40; H01L 23/4093; H05K 7/2039; H05K 7/20436; H05K 7/2049; H05K 7/20; H05K 7/20409; H05K 7/20418; F28F 9/262; G02B 6/4269
See application file for complete search history.

(56) References Cited

U.S. PATENT DOCUMENTS

| | | |
|---|---|---|
| 10,222,844 B1 | 3/2019 | Reddy et al. |
| 10,295,767 B2 | 5/2019 | Chen et al. |
| 10,651,598 B2 * | 5/2020 | Chen ................... G02B 6/4261 |
| 2005/0024823 A1 | 2/2005 | Jo |

OTHER PUBLICATIONS

Notice of allowance received for U.S. Appl. No. 17/547,236 mailed on Jun. 6, 2023, 8 pages.

* cited by examiner

CONNECTOR ASSEMBLY WITH MOVABLE HEAT SINK

RELATED APPLICATIONS

This application is a continuation of U.S. patent application Ser. No. 17/547,236, filed Dec. 10, 2021, titled "CONNECTOR ASSEMBLY WITH MOVABLE HEAT SINK," which claims priority to Chinese Patent Application No. 202011456509.9, filed Dec. 10, 2020, the entire contents of each of which applications are hereby incorporated herein by reference.

TECHNICAL FIELD

The present disclosure relates to a connector assembly, and particularly relates to a connector assembly having a heat sink module.

BACKGROUND

Chinese disclosure patent application publication No. CN110296628A (corresponding to U.S. Pat. No. 10,651,598 B2) discloses a heat exchange structure, the heat exchange structure includes a metal piece, a lever and a framework, the framework is used to support the lever and the metal piece, a front end of the metal piece is fixed on a front edge of the framework by a fastener such as a rivet. When a heat source slides relative to a heat sink, the heat source contacts one end of the lever and actuates the other end of the lever to contact a rear end of the metal piece, the metal piece downwardly pushes the heat sink and a thermal conductive pad provided on the heat sink to contact the heat source. However, in such a prior art, the framework needs to be additionally provided for mounting the lever and the metal piece. And the metal piece needs to be provided to a top portion of the heat sink, which results in that the top portion of the heat sink needs to be grooved to mount the metal piece, so a heat dissipating area of the heat sink is decreased. In addition, the metal piece and the heat sink are engaged with each other through only single-point (screw), and when the lever is pushed, the lever is pressed on the rear end of the metal piece, such as design would make the heat sink easily skew.

SUMMARY

Therefore, an object of the present disclosure is to provide a connector assembly which can improve at least one deficiency in the prior art.

An example connector assembly includes a guide shielding cage with a cage body and an upper heat sink bracket. The cage body includes a upper insertion space. A top wall of the cage body includes an upper window which is communicated to the upper insertion space. The upper heat sink bracket is assembled to the top wall of the cage body. The upper heat sink bracket includes an interior receiving space, and a lower wall of the upper heat sink bracket is formed with a corresponding window which corresponds to the upper window. The connector assembly also includes an upper heat sink module in the interior receiving space of the upper heat sink bracket.

The upper heat sink module includes a heat dissipating member capable of moving between a releasing position which is higher relative to the upper insertion space and an acting position which is lower relative to the upper insertion space. The cage body further includes fixing pieces positioned at two sides of the top wall and extend upwardly, the lower wall of the upper heat sink bracket engages with the fixing pieces of the cage body, and the upper heat sink bracket further comprises a latching piece which extends from the lower wall and latches into the top wall of the cage body.

In other aspects of the embodiments, the upper heat sink bracket further includes two insertion pieces which respectively extend downwardly from two side walls of the upper heat sink bracket and correspondingly engage with two side walls of the cage body. In other aspects, each side wall among the two side walls of the cage body includes an insertion groove, and the two insertion pieces correspondingly insert into the insertion grooves. In other aspects, the two insertion pieces respectively extend downwardly and rearwardly from the two side walls of the upper heat sink bracket and correspondingly rearwardly insert into the insertion grooves, and the latching piece extends rearwardly and downwardly from a rear end of the lower wall of the upper heat sink bracket.

In other aspects of the embodiments, each fixing piece among the fixing pieces includes a fixing groove, the lower wall of the upper heat sink bracket is snapped into the fixing grooves of the fixing pieces of the cage body, the top wall of the cage body further comprises a latching groove, and the latching piece extends rearwardly from the lower wall of the upper heat sink bracket and correspondingly latches into the latching groove. Each fixing groove of the fixing pieces opens forwardly, each insertion groove opens forwardly, and the latching groove is positioned behind the upper window of the cage body.

In other aspects of the embodiments, the lower wall of the upper heat sink bracket includes slits, the fixing pieces pass through the slits, and a part of the lower wall positioned in front of the slits is snapped into the fixing grooves of the fixing pieces of the cage body. In other aspects, a lower portion of two sides of the upper heat sink bracket comprise side stop pieces which extend downwardly and abut against two side walls of the cage body.

Another example connector assembly includes a cage body with an upper insertion space. A top wall of the cage body includes an upper window which is communicated to the upper insertion space. The connector assembly also includes an upper heat sink bracket assembled over the top wall of the cage body. A lower wall of the upper heat sink bracket includes a corresponding window which corresponds to the upper window of the top wall of the cage body. The connector assembly also includes an upper heat sink module including a heat dissipating member in the upper heat sink bracket. The cage body further includes fixing pieces positioned at two sides of the top wall and extend upwardly, the lower wall of the upper heat sink bracket engages with the fixing pieces of the cage body, and the upper heat sink bracket further comprises a latching piece which extends from the lower wall and latches into the top wall of the cage body.

In other aspects of the embodiments, the upper heat sink module further includes a heat dissipating member. The heat dissipating member is capable of moving between a releasing position which is higher relative to the upper insertion space and an acting position which is lower relative to the upper insertion space. In other aspects, the top wall of the cage body further includes a latching groove, the latching groove is positioned behind the upper window of the cage body, and the latching piece extends rearwardly and downwardly from a rear end of the lower wall of the upper heat sink bracket and latches into the latching groove. In other aspects, side walls of the cage body include insertion grooves, and the upper heat sink bracket further includes two insertion pieces which insert into the insertion grooves.

In other aspects of the embodiments, the two insertion pieces respectively extend downwardly and rearwardly from two side walls of the upper heat sink bracket and correspondingly rearwardly insert into the insertion grooves, and the latching piece extends rearwardly and downwardly from a rear end of the lower wall of the upper heat sink bracket. The lower wall of the upper heat sink bracket includes slits, and the fixing pieces pass through the slits respectively. Each fixing piece among the fixing pieces includes a fixing groove, and a part of the lower wall positioned in front of the slits is snapped into the fixing grooves of the fixing pieces of the cage body.

In other aspects of the embodiments, a lower portion of two sides of the upper heat sink bracket includes side stop pieces which extend downwardly and abut against two side walls of the cage body. In other aspects, the upper heat sink module further includes a pressure applying elastic member, and the pressure applying elastic member downwardly pushes the heat dissipating member to an acting position. The upper heat sink module further includes a pressure applying elastic member and a supporting elastic member, the supporting elastic member upwardly and elastically supports the heat dissipating member, and the pressure applying elastic member downwardly pushes the heat dissipating member to the acting position and makes the heat dissipating member downwardly compress the supporting elastic member.

Another example connector assembly includes a cage body including an upper insertion space, where a top wall of the cage body includes an upper window which is communicated to the upper insertion space. The connector assembly also includes an upper heat sink bracket over the top wall of the cage body and an upper heat sink module in the upper heat sink bracket. The upper heat sink module includes a heat dissipating member being capable of moving between a releasing position which is higher relative to the upper insertion space and an acting position which is lower relative to the upper insertion space. The cage body further includes fixing pieces positioned at two sides of the top wall and extend upwardly, the lower wall of the upper heat sink bracket engages with the fixing pieces of the cage body, and the upper heat sink bracket further comprises a latching piece which extends from the lower wall and latches into the top wall of the cage body.

In other aspects of the embodiments, the upper heat sink module further includes a pressure applying elastic member and a supporting elastic member, the supporting elastic member upwardly and elastically supports the heat dissipating member, and the pressure applying elastic member downwardly pushes the heat dissipating member to the acting position and makes the heat dissipating member downwardly compress the supporting elastic member.

BRIEF DESCRIPTION OF THE DRAWINGS

Other features and effects of the present disclosure will be apparent in an embodiment referring to the accompanying drawings in which.

DETAILED DESCRIPTION OF THE PREFERRED EMBODIMENTS

Figure 1:
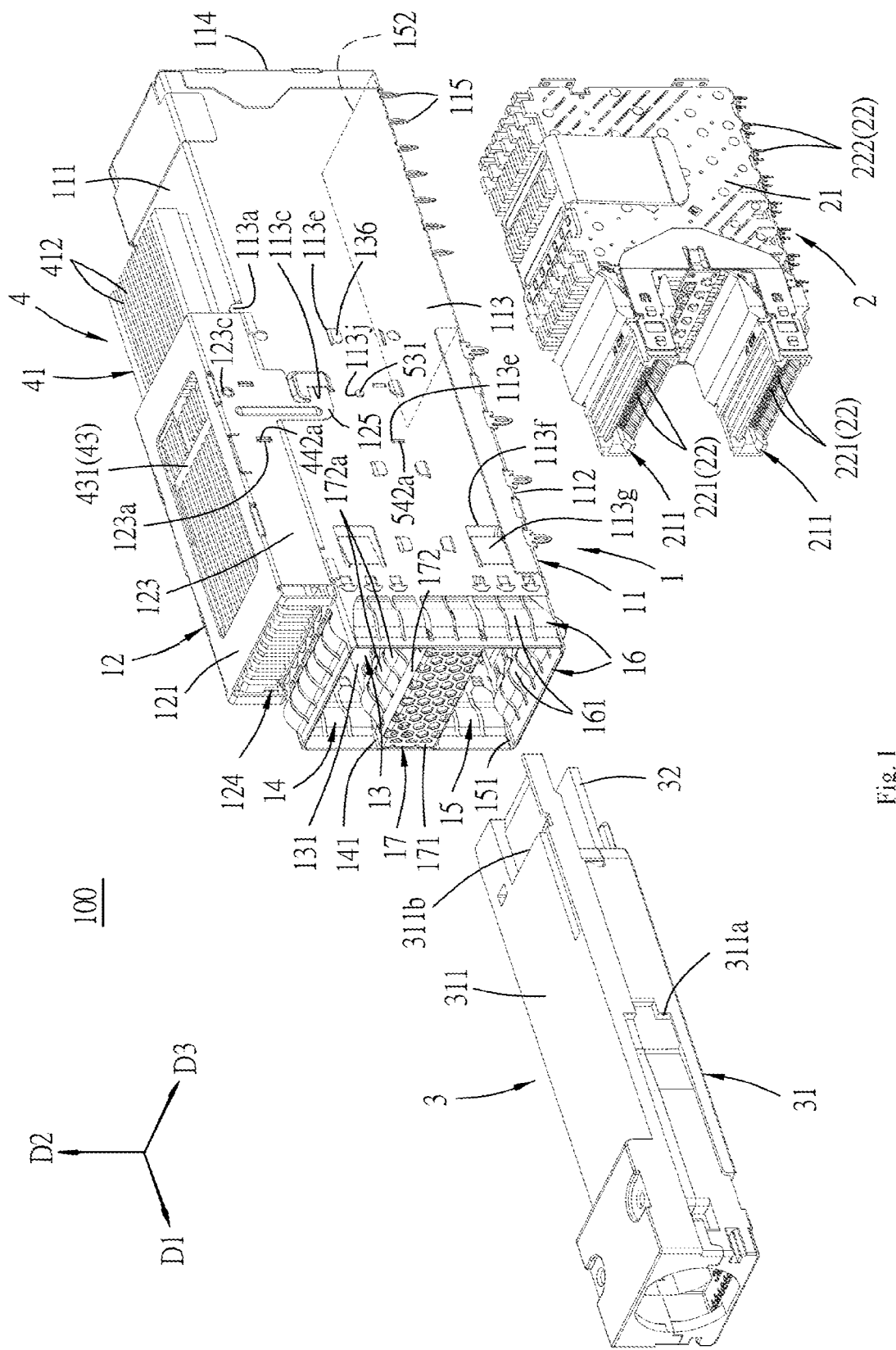
FIG. 1 is a perspective exploded view of a first embodiment of a connector assembly of the present disclosure.

Before the present disclosure is described in detail, it is noted that the similar components are indicated by the same reference numerals in the following description.

Figure 2:
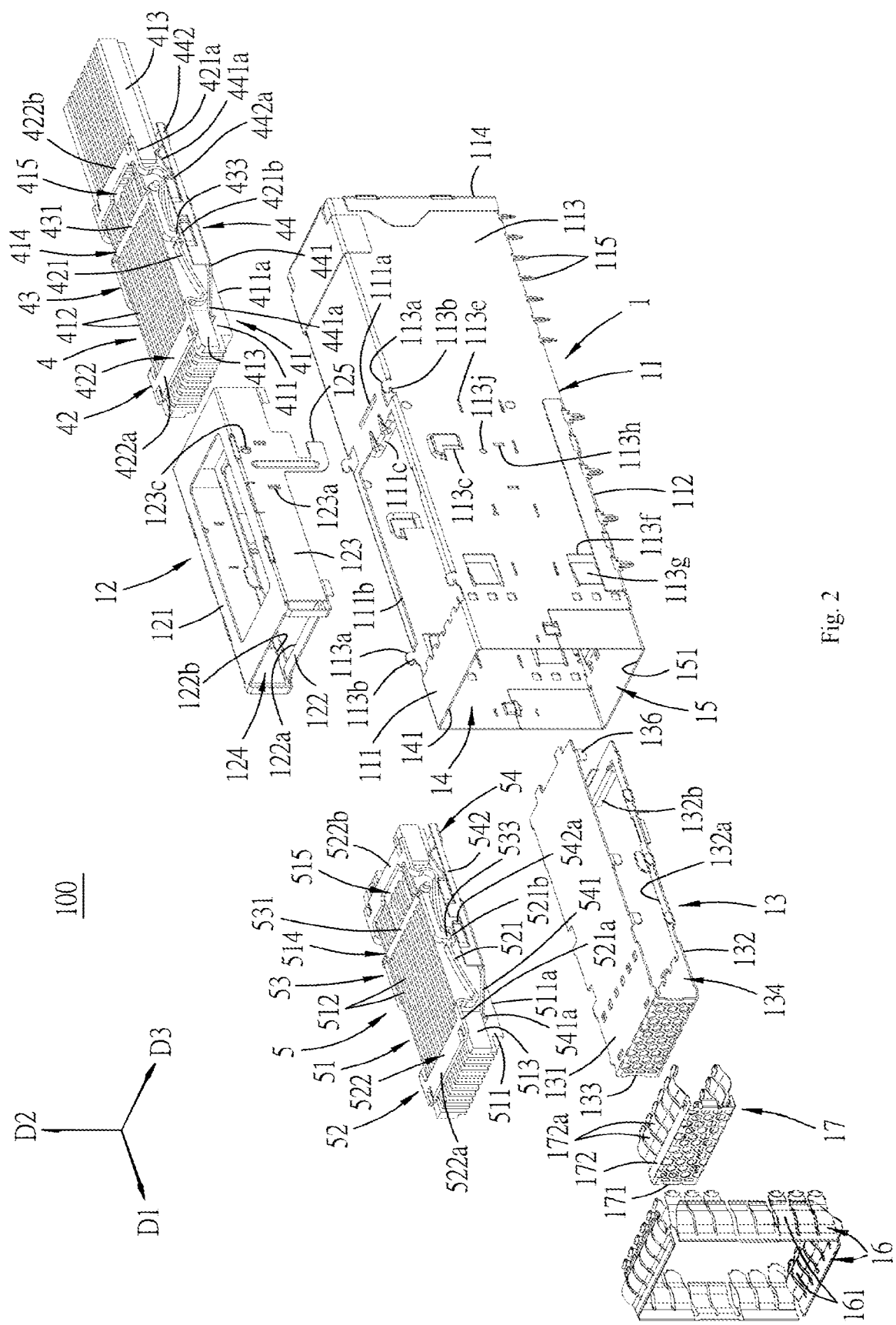
FIG. 2 is a perspective further exploded view of the first embodiment.
Figure 3:
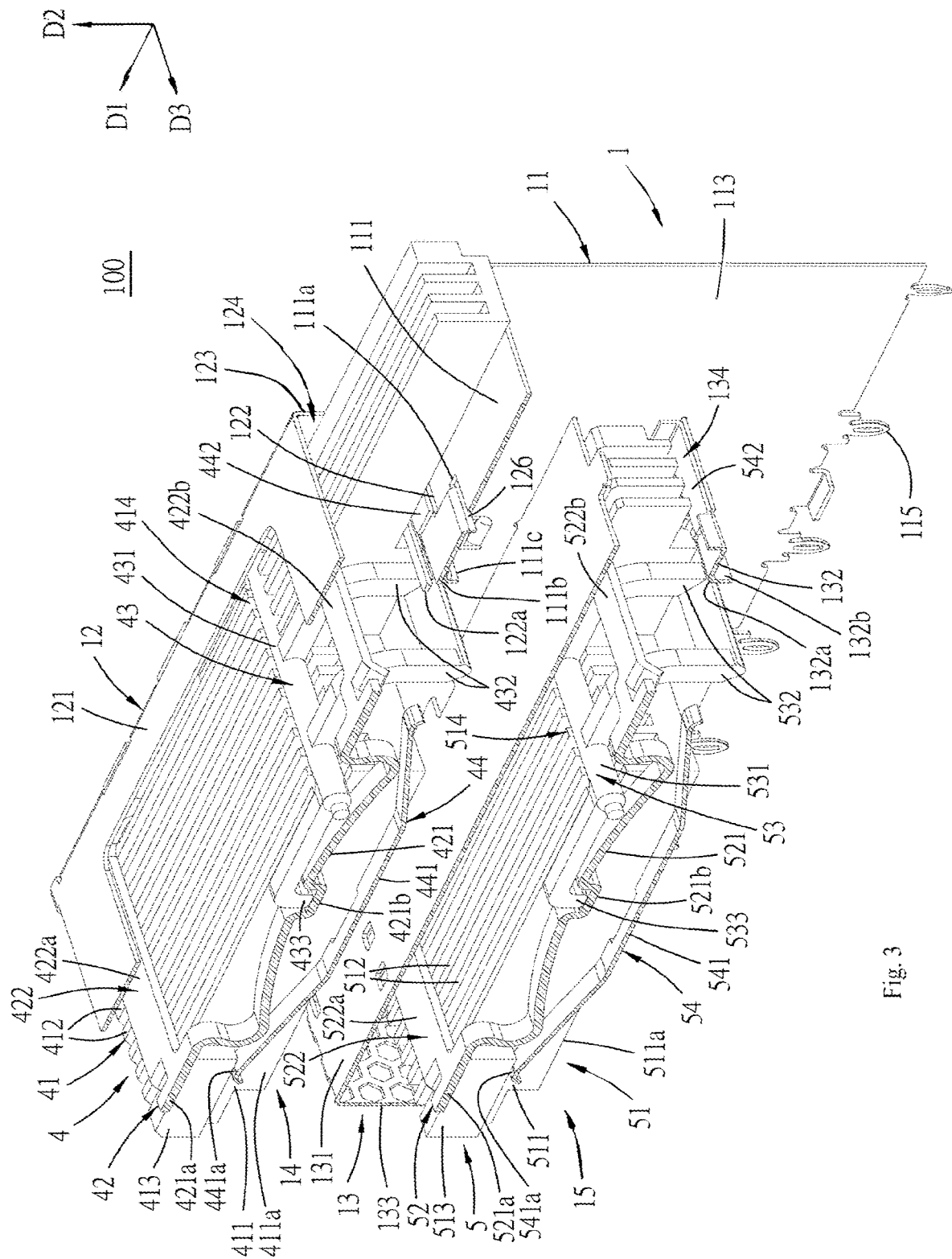
FIG. 3 is a perspective partial cross sectional view of the first embodiment.

Referring to FIG. 1 to FIG. 3, a first embodiment of a connector assembly 100 of the present disclosure includes a guide shielding cage 1, a receptacle connector 2, a pluggable module 3, an upper heat sink module 4 and a lower heat sink module 5.

The guide shielding cage 1 for example is formed by processing a metal plate, such as stamping and bending, the guide shielding cage 1 is used to be provided to a circuit board (not shown) and extends along a front-rear direction D1 (in which an arrow pointing direction is front and an opposite direction is rear), the guide shielding cage 1 includes a cage body 11 and an upper heat sink bracket 12 and a lower heat sink bracket 13 which are assembled to the cage body 11. The cage body 11 has a top wall 111, a bottom wall 112 which is spaced apart from the top wall 111 along an up-down direction D2 (in which an arrow pointing direction is up and an opposite direction is down), two side walls 113 which are spaced apart from each other along a left-right direction D3 (in which an arrow pointing direction is right and an opposite direction is left) and are connected between the top wall 111 and the bottom wall 112, a rear wall 114 which is connected to a rear edge of the top wall 111 and rear edges of the two side walls 113, and a plurality of insertion legs 115 which extend downwardly from the two side walls 113 and the rear wall 114 and are adapted to be fixed on the circuit board and/or be connected to ground trace (not shown).

Referring to FIG. 1 to FIG. 5, the upper heat sink bracket 12 is assembled on the top wall 111 of the cage body 11. The upper heat sink bracket 12 has an upper wall 121, a lower wall 122 and two side walls 123, the upper wall 121, the lower wall 122 and the two side walls 123 together define an interior receiving space 124. The top wall 111 of the cage body 11 has four fixing pieces 113a which extend upwardly, the two side walls 113 each have an insertion groove 113c which opens forwardly, each fixing piece 113a is formed with a fixing groove 113b which opens forwardly. The top wall 111 of the cage body 11 further has a latching groove 111a positioned behind an upper window 111b. The upper heat sink bracket 12 further has two insertion pieces 125 which respectively extend downwardly and rearwardly from the two side walls 123 and correspondingly rearwardly insert into the corresponding insertion grooves 113c and a latching piece 126 which extends rearwardly and downwardly from a rear end of the lower wall 122 and correspondingly latches into the latching groove 111a, in addition, the lower wall 122 of the upper heat sink bracket 12 is formed with two slits 122b which are adjacent to the two side walls 123 respectively and are along the front-rear direction D1, the two fixing pieces 113 which are positioned in the front in the four fixing pieces 113 pass through the two slits 122b respectively, and a part of the lower wall 122 positioned in front of the two slits 122b and a rear end of the lower wall 122 respectively snapped into the fixing grooves 113b of the four fixing pieces 113a of the cage body 11, so that the upper heat sink bracket 12 is stably assembled to the top wall 111 of the cage body 11.

The lower heat sink bracket 13 is assembled in the cage body 11, and the lower heat sink bracket 13 and the cage body 11 together define an upper insertion space 14 and a lower insertion space 15. The lower heat sink bracket 13 has an upper wall 131 and a lower wall 132 which face each other in the up-down direction and a front wall 133 which is connected to a front edge of the upper wall 131 and a front edge of the lower wall 132, the upper wall 131, the lower wall 132 and the front wall 133 together define an interior receiving space 134. Each side wall 113 of the cage body 11 further has apertures 113e, the lower heat sink bracket 13 further has fixing bendable pieces 136 which laterally extend outwardly from the upper wall 131 and the lower wall 132, positioning pieces 135 correspondingly insert into positioning holes 113d of the two side walls 113 of the cage body 11, the fixing bendable pieces 136 pass through the apertures 113e of the two side walls 113 of the cage body 11 respectively and are bent, and so that the lower heat sink bracket 13 is stably assembled and provided in the cage body 11.

In the first embodiment, a rear segment of the upper insertion space 14 and a rear segment of the lower insertion space 15 are communicated with each other. The upper insertion space 14 has an upper port 141 which is toward the front; the lower insertion space 15 has a lower port 151 which is toward the front and a bottom opening 152 which is positioned at the rear of a bottom portion, is defined together by the bottom wall 112, the two side walls 113 and the rear wall 114 and is toward the down.

The receptacle connector 2 is used to be provided on the circuit board, and is provided to the rear segment of the upper insertion space 14 of the guide shielding cage 1 and the rear segment of the lower insertion space 15 of the guide shielding cage 1 via the bottom opening 152, the receptacle connector 2 has a housing 21 which is insulative and a plurality of terminals 22 which are provided to the housing 21, the housing 21 has two matting slots 211 which are toward the front and respectively correspond to the upper insertion space 14 and the lower insertion space 15, each terminal 22 has a contact portion 221 which is positioned in the corresponding matting slot 211 and a tail portion 222 which extend downwardly out of a bottom portion of the housing 21, the tail portions 222 of the plurality of terminals 22 are respectively used to be provided to the circuit board.

The pluggable module 3 has a shell 31 and a mating circuit board 32. The shell 31 has an inserting portion 311 which is used to insert into the upper insertion space 14 from the upper port 141 or the lower insertion space 15 from the lower port 151, the mating circuit board 32 protrudes from the inserting portion 311, is provided to the inserting portion 311 and is used to insert into the corresponding matting slot 211. Each side wall 113 of the cage body 11 of the guide shielding cage 1 has two openings 113f which respectively correspond to the upper insertion space 14 and the lower insertion space 15, an inward extension elastic piece 113g is constructed at each opening 113f and rearwardly extends obliquely toward the inside of the cage body 11. A left side and a right side of the inserting portion 311 of the pluggable module 3 are respectively provided with locking recessed grooves 311a which correspondingly engage with the inward extension elastic pieces 113g, the inward extension elastic pieces 113g respectively at the openings 113f are used to respectively engage with the locking recessed grooves 311a of the pluggable module 3 which inserts into the upper insertion space 14 or the lower insertion space 15, so as to generate a locking effect. In addition, an aligning structure 311b is further formed at a top portion of a front end of the inserting portion 311 of the shell 31. The top wall 111 of the cage body 11 is formed with an upper window 111b which is communicated to the upper insertion space 14 and an upper stopping portion 111c which extends downwardly from a rear segment of the upper window 111b into the upper insertion space 14; the lower wall 122 of the upper heat sink bracket 12 is formed with a corresponding window 122a which corresponds to the upper window 111b. The lower wall 132 of the lower heat sink bracket 13 is formed with a lower window 132a which makes the interior receiving space 134 communicated to the lower insertion space 15 and a lower stopping portion 132b which extends downwardly from a rear segment of the lower window 132a into the lower insertion space 15. The upper stopping portion 1/1c and the lower stopping portion 132b are used to stop the aligning structure 311b of the pluggable module 3 so as limit an insertion position of the pluggable module 3.

In the present embodiment, the guide shielding cage 1 of the connector assembly 100 may be provided to a mounting hole (not shown) of a casing (not shown), the guide shielding cage 1 further has a plurality of first ground members 16 which are provided at a front end of the cage body 11 and a second ground member 17 which is provided to a front segment of the lower heat sink bracket 13. The plurality of first ground members 16 has a plurality of elastic fingers 161 which extend rearwardly from the front end of the cage body 11 and are distributed to an outer side of the cage body 11 and an inner side of the cage body 11, the elastic finger 161 of the plurality of elastic fingers 161 which is positioned at the outer side of the cage body 11 is used to contact an edge of the mounting hole of the casing, the elastic finger 161 of the plurality of elastic fingers 161 which is positioned at the inner side of the cage body 11 is used to contact the pluggable module 3. The second ground member 17 has a sheet body 171 which is provided to a front side face of the front wall 133 of the lower heat sink bracket 13 and two ground sheets 172 which rearwardly extend respectively from an upper edge and a lower edge of the sheet body 171 to respectively enter into the upper insertion space 14 and the lower insertion space 15. Each ground sheet 172 has elastic fingers 172a which extend rearwardly and are used to contact the pluggable module 3.

It is noted that, although the guide shielding cage 1 has the two insertion spaces (the upper insertion space 14 and the lower insertion space 15) and the two heat sink brackets (the upper heat sink bracket 12 and the lower heat sink bracket 13) corresponding to the upper heat sink module 4 and the lower heat sink module 5 respectively in the first embodiment, but in other implementing manners, the guide shielding cage 1 also may only have one insertion space and one heat sink bracket corresponding to one heat sink module, or have three or more insertion spaces and three or more heat sink brackets corresponding to three or more heat sink modules, so the present disclosure is not limited to the first embodiment.

Referring to FIG. 2 to FIG. 4 and FIG. 6 to FIG. 7, the upper heat sink module 4 is mounted to the interior receiving space 124 of the upper heat sink bracket 12 and corresponds to the upper insertion space 14, the upper heat sink module 4 include a heat dissipating member 41, two pressure applying elastic members 421, a lever member 43 and two supporting elastic members 441. The heat dissipating member 41 has a base plate 411 and a plurality of heat dissipating fins 412 which extend along the front-rear direction D1, are arranged side by side in the left-right direction D3 and are integrally formed upwardly from a top face of the base plate 411. It is noted that, in a varied embodiment, the plurality of heat dissipating fins 412 also may be that a plurality of plate bodies latch with each other and are provided to the top face of the base plate 411 by for example welding manner. A bottom portion of the base plate 411 has a thermal coupling portion 411a which faces downwardly, the thermal coupling portion 411a is used to pass through the corresponding window 122a and the upper window 111b so as to contact the pluggable module 3 which inserts into the upper insertion space 14, thereby strengthening heat dissipation performance of the upper heat sink module 4, and in the present embodiment, a bottom portion of the thermal coupling portion 411a is provided with a thermal conductive pad 411b which is used to contact the pluggable module 3, the thermal conductive pad 411b for example may a thermal interface material, and the thermal interface material may be selected from a combination of materials for example which have properties, such as high thermal conductivity, high flexibility, compressibility, insulation, abrasion resistance and the like, for example, may be selected from a combination of a substrate material and a phase change material.

The two pressure applying elastic members 421 are respectively provided at a left side face and a right side face of the heat dissipating member 41, outer side faces of the left side face and the right side face of the heat dissipating member 41 each have two acting protrusions 413 which are formed to protrude outwardly, and, the two acting protrusions 413 at each side are arranged in the front-rear direction and spaced apart from each other. Each pressure applying elastic member 421 has two heat dissipating member acting portions 421a which are respectively positioned at a front end and a rear end of each pressure applying elastic member 421 and are used to push the heat dissipating member 41 and a lever acting portion 421b which is positioned at a middle of each pressure applying elastic member 421 and is used to be applied a pressure by the lever member 43, the heat dissipating member acting portions 421a of the two pressure applying elastic members 421 respectively apply pressures downwardly from above the acting protrusions 413 to push the heat dissipating member 41, the design that the lever acting portion 421b is positioned at the middle of each pressure applying elastic member 421 can balance acting forces of the two pressure applying elastic members 421. In the first embodiment, an upper frame portion 422 is integrally connected between the two pressure applying elastic members 421 and is provided to a top portion of the heat dissipating member 41, the upper frame portion 422 includes a front frame 422a which is connected between the heat dissipating member acting portions 421a of the two pressure applying elastic members 421 positioned in the front and a rear frame 422b which is connected between the heat dissipating member acting portions 421a of the two pressure applying elastic members 421 positioned in the rear, the front frame 422a and the rear frame 422b each have downward bend pieces 422c which are positioned at a left side and a right side respectively and bend downwardly to be received in receiving grooves 416 at the top portion of the heat dissipating member 41, thereby strengthening limiting in position and stability between the front frame 422a and the rear frame 422b and the heat dissipating member 41. The two pressure applying elastic members 421 and the front frame 422a and the rear frame 422b of the upper frame portion 422 together constitute a pressure applying framework 42, thereby increasing balance between actions from forces applied by the two pressure applying elastic members 421.

The lever member 43 has a pivoting bar 431 which extends along the left-right direction D3 and is pivoted to two pivoting holes 123c of the two side walls 123 of the upper heat sink bracket 12 of the guide shielding cage 1 at two ends thereof, two pushed ends 432 which extend rearwardly and downwardly from the pivoting bar 431 and are used to be pushed, and two pressure applying ends 433 which extends forwardly and downwardly from the pivoting bar 431 and are respectively used to downwardly apply pressures to the two pressure applying elastic members 421. The two pushed ends 432 are connected with each other and can enter into the upper insertion space 14 via the upper window 111b and the corresponding window 122a, the two pressure applying ends 433 respectively extend to the left side face and the right side face of the heat dissipating member 41 and respectively are used to apply pressures to the two lever acting portions 421b of the two pressure applying elastic members 421, the two pressure applying ends 433 of the two lever members 43 are respectively positioned above the two lever acting portions 421b of the two pressure applying elastic members 421, each lever acting portion 421b constitutes a recessed portion which opens upwardly and receives the corresponding pressure applying end 433 of the lever member 43. In addition, in the first embodiment, the heat dissipating member 41 is formed with a first avoiding groove 414 which opens upwardly and avoids the pivoting bar 431 and a second avoiding groove 415 which penetrates in the up-down direction to allow the two pushed ends 432 pass through downwardly.

The two supporting elastic members 441 are respectively provided at the left side face and the right side face of the heat dissipating member 41 and upwardly and elastically support the heat dissipating member 41, each supporting elastic member 441 has two elastic supporting portions 441a which are arranged in the front-rear direction and upwardly support the heat dissipating member 41, the elastic supporting portions 441a of the two supporting elastic members 441 upwardly abut against the acting protrusions 413 from below respectively to support the heat dissipating member 41. Each side wall 123 of the upper heat sink bracket 12 is formed with assembling holes 123a, an end frame portion 442 which is U-shaped is integrally connected between the two supporting elastic members 441, the two supporting elastic members 441 and the end frame portion 442 together constitute a supporting framework 44, the end frame portion 442 has assembling pieces 442a which protrude outwardly along the left-right direction D3 and correspondingly insert into the assembling holes 123a, the end frame portion 442 can increase balance between the two supporting elastic members 441 and stably fix the two supporting elastic members 441. In addition, the two supporting elastic members 441 each are formed with an assembling recessed portion 441b positioned at an inner side thereof, the lower wall 122 of the upper heat sink bracket 12 has two assembling pieces 122c which extend upwardly from two sides of the corresponding window 122a and correspondingly pass through the two assembling recessed portions 441b of the two supporting elastic members 441, each assembling piece 122c is formed with an assembling groove 122d which opens rearwardly, parts of the two supporting elastic members 441 respectively positioned at rear ends of the two assembling recessed portions 441b respectively forwardly snap into the two assembling grooves 122d of the two assembling pieces 122c, thereby further strengthening stability of the two supporting elastic members 441.

Referring to FIG. 2 to FIG. 4 and FIG. 8 to FIG. 9, the lower heat sink module 5 is mounted to the interior receiving space 134 of the lower heat sink bracket 13 and corresponds to the lower insertion space 15, the lower heat sink module 5 is substantially the same as the upper heat sink module 4 in structure, and includes a heat dissipating member 51, two pressure applying elastic members 521, a lever member 53 and two supporting elastic members 541. The heat dissipating member 51 has a base plate 511 and a plurality of heat dissipating fins 512 which extend along the front-rear direction D1, are arranged side by side in the left-right direction D3 and are integrally formed upwardly from a top face of the base plate 511. The base plate 511 has a thermal coupling portion 511a which is formed downwardly, the thermal coupling portion 511a is used to pass through the lower window 132a so as to contact the pluggable module 3 which inserts into the lower insertion space 15, thereby strengthening heat dissipation performance of the lower heat sink module 5, and in the present embodiment, a bottom portion of the thermal coupling portion 511a is provided with a thermal conductive pad 511b which is used to contact the pluggable module 3.

The two pressure applying elastic members 521 are respectively provided at a left side face and a right side face of the heat dissipating member 51, outer side faces of the left side and the right side of the heat dissipating member 51 each have two acting protrusions 513 which are formed to protrude outwardly, and, the two acting protrusions 513 at each side are arranged to be spaced apart from each other in the front-rear direction. Each pressure applying elastic member 521 has two heat dissipating member acting portions 521a which are respectively positioned at a front end and a rear end of each pressure applying elastic member 521 and are used to push the heat dissipating member 51 and a lever acting portion 521b which is positioned at a middle of each pressure applying elastic member 521 and is used to be applied a pressure by the lever member 53, the heat dissipating member acting portions 521a of the two pressure applying elastic members 521 respectively apply pressures downwardly from above the acting protrusions 513 to push the heat dissipating member 51, the design that the lever acting portion 521b is positioned at the middle of each pressure applying elastic member 521 can balance acting forces of the two pressure applying elastic members 521. In the first embodiment, an upper frame portion 522 is integrally connected between the two pressure applying elastic members 521 and is provided to a top portion of the heat dissipating member 51, the upper frame portion 522 includes a front frame 522a which is connected between the two heat dissipating member acting portions 521a of the two pressure applying elastic members 521 positioned in the front and a rear frame 522b which is connected between the two heat dissipating member acting portions 521a of the two pressure applying elastic members 521 positioned in the rear, the front frame 522a and the rear frame 522b each have downward bend pieces 522c which are respectively positioned at a left side and a right side and bend downwardly to be received in the receiving grooves 516 of the top portion of the heat dissipating member 51, thereby strengthening limit in position and stability between the front frame 522a and the rear frame 522b and the heat dissipating member 51. The two pressure applying elastic members 521 and the front frame 522a and the rear frame 522b of the upper frame portion 522 together constitute a pressure applying framework 52, thereby increasing balance between actions from forces applied by the two pressure applying elastic members 521.

The lever member 53 has a pivoting bar 531 which extends along the left-right direction D3 and is pivoted to pivoting holes 113j of the two side walls 113 of the cage body 11 of the guide shielding cage 1 at two ends thereof, two pushed ends 532 which extend rearwardly and downwardly from the pivoting bar 531 and are used to be pushed and two pressure applying ends 533 which extend forwardly and downwardly from the pivoting bar 531 and are used to downwardly apply pressures to the two pressure applying elastic members 521 respectively. The two pushed ends 532 are connected with each other and can enter into the lower insertion space 15 via the lower window 132a, the two pressure applying ends 533 respectively extend to the left side face and the right side face of the heat dissipating member 51 and are used to apply pressures to the two lever acting portions 521b of the two pressure applying elastic members 521 respectively, the two pressure applying ends 533 of the two lever members 53 are respectively positioned above the two lever acting portions 521b of the two pressure applying elastic members 521, each lever acting portion 521b constitutes a recessed portion which opens upwardly and receives the corresponding pressure applying end 533 of the lever member 53. In addition, in the first embodiment, the heat dissipating member 51 is formed with a first avoiding groove 514 which opens upwardly and avoids the pivoting bar 531 and a second avoiding groove 515 which penetrates in the up-down direction to allow the two pushed ends 532 to pass through downwardly.

The two supporting elastic members 541 are respectively provided at the left side face and the right side face of the heat dissipating member 51 and upwardly and elastically support the heat dissipating member 51, each supporting elastic member 541 has two elastic supporting portions 541a which are arranged in the front-rear direction and upwardly support the heat dissipating member 51, the elastic supporting portions 541a of the two supporting elastic members 541 upwardly abut against the acting protrusions 513 from below respectively to support the heat dissipating member 51. Each side wall 113 of the cage body 11 is formed with assembling holes 113h, an end frame portion 542 which is U-shaped is integrally connected between the two supporting elastic members 541, the two supporting elastic members 541 and the end frame portion 542 together constitute a supporting framework 54, the end frame portion 542 has assembling pieces 542a which protrude outwardly along the left-right direction D3 and correspondingly insert into the assembling holes 113h, the end frame portion 542 can increase balance between the two supporting elastic members 541 and stably fix the two supporting elastic members 541. In addition, the two supporting elastic members 541 each are formed with an assembling recessed portion 541b which is positioned at an inner side thereof, the lower wall 132 of the lower heat sink bracket 13 has two assembling pieces 132c which extend upwardly from two side of the lower window 132a and correspondingly pass through the two assembling recessed portions 541b of the two supporting elastic members 541, each assembling piece 132c is formed with an assembling groove 132d which opens rearwardly, parts of the two supporting elastic members 541 respectively positioned at rear ends of the two assembling recessed portions 541b respectively forwardly snap into the two assembling grooves 132d of the two assembling pieces 132c, thereby further strengthening stability of the two supporting elastic members 541.

Referring to FIG. 2 to FIG. 4 and FIG. 10, with action of the lever member 43(53), the heat dissipating member 41(51) can move between a releasing position which is higher relative to the insertion space (the upper insertion space 14 or the lower insertion space 15) and an acting position which is lower relative to the insertion space (the upper insertion space 14 or the lower insertion space 15) and where the thermal coupling portion 411a(511a) enters into the insertion space (the upper insertion space 14 or the lower insertion space 15) and can contact a surface of the pluggable module 3, it is noted that, when the heat dissipating member 41(51) is in the releasing position, the heat dissipating member 41(51) is limited in a direction toward the up by the upper wall 121 of the upper heat sink bracket 12 or the upper wall 131 of the lower heat sink bracket 13, when the heat dissipating member 41(51) is in the acting position, the heat dissipating member 41(51) is limited in a direction toward the down by the supporting elastic member 441 (541), in addition, when the heat dissipating member 41(51) is in the releasing position, the thermal coupling portion 411a(511a) for example may not enter into the insertion space (the upper insertion space 14 or the lower insertion space 15) or positioned at a height where the thermal coupling portion 411a(511a) cannot contact the pluggable module 3.

Figure 4:
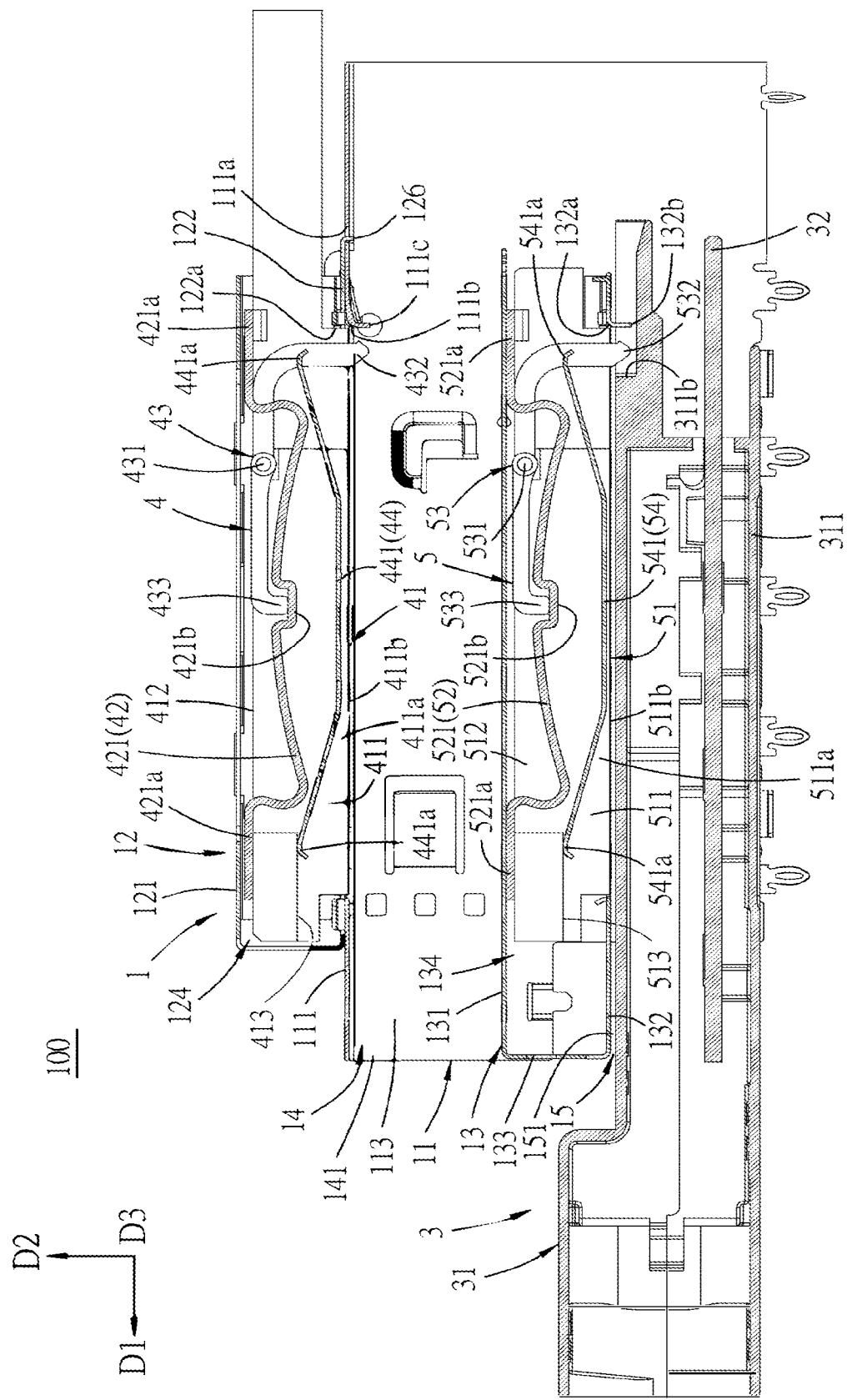
FIG. 4 is a partial cross sectional schematic view of the first embodiment, in which a pluggable module of the first embodiment has not completely inserted into a guide shielding cage.
Figure 5:
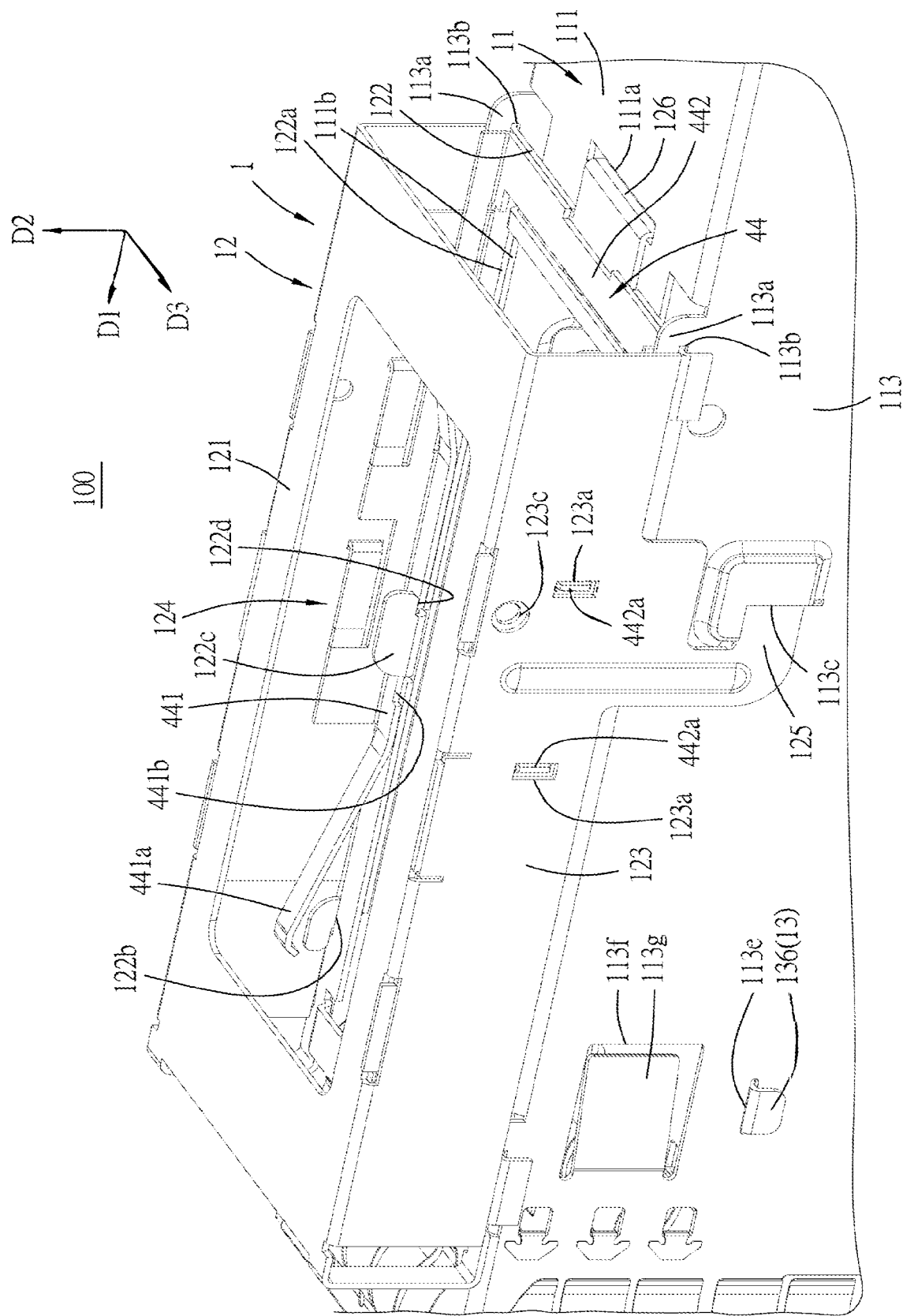
FIG. 5 is a partially enlarged perspective view of a cage body of the guide shielding cage and an upper heat sink bracket of the first embodiment.
Figure 6:
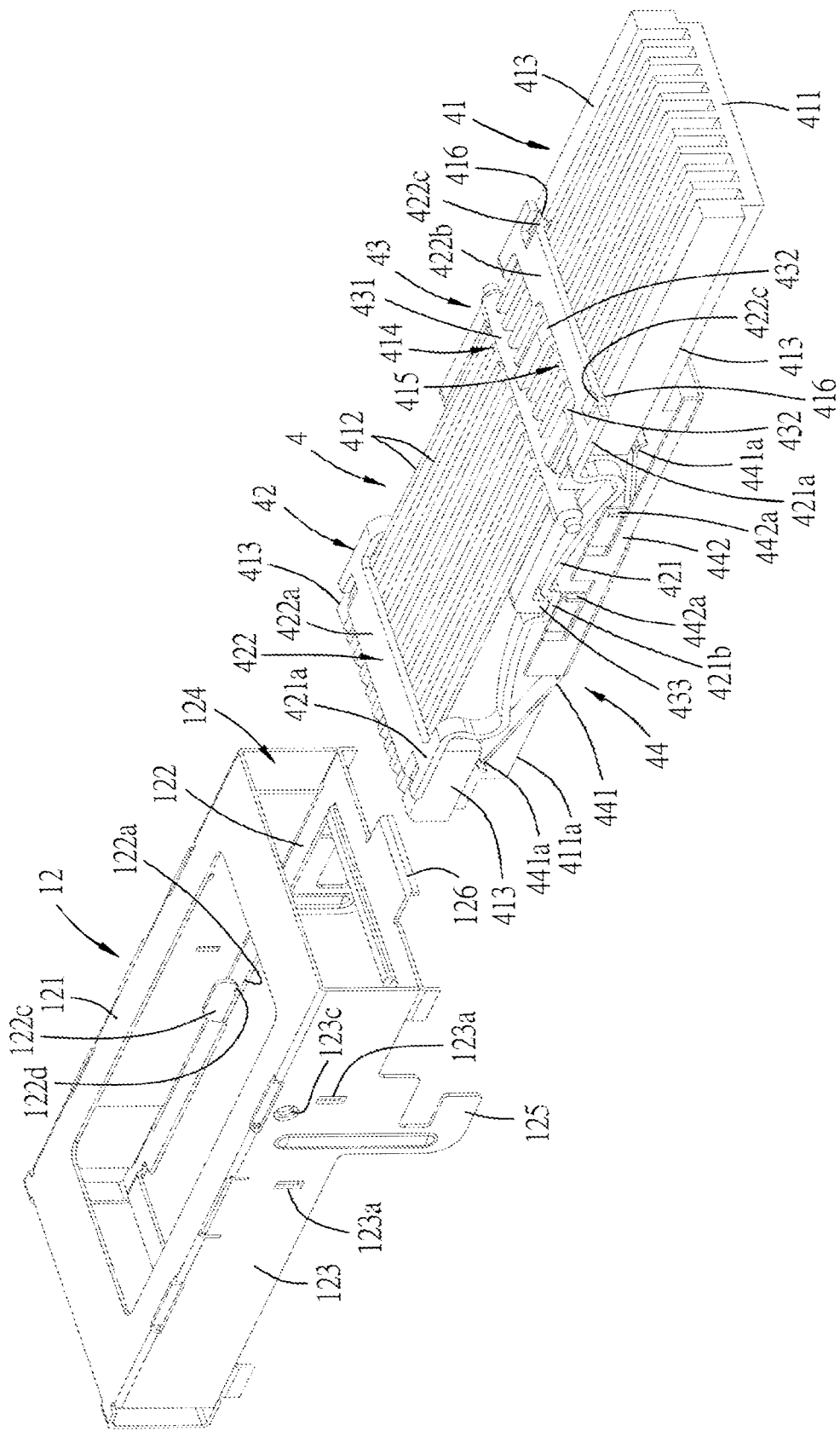
FIG. 6 is a perspective exploded view of the upper heat sink bracket and an upper heat sink module of the first embodiment.
Figure 7:
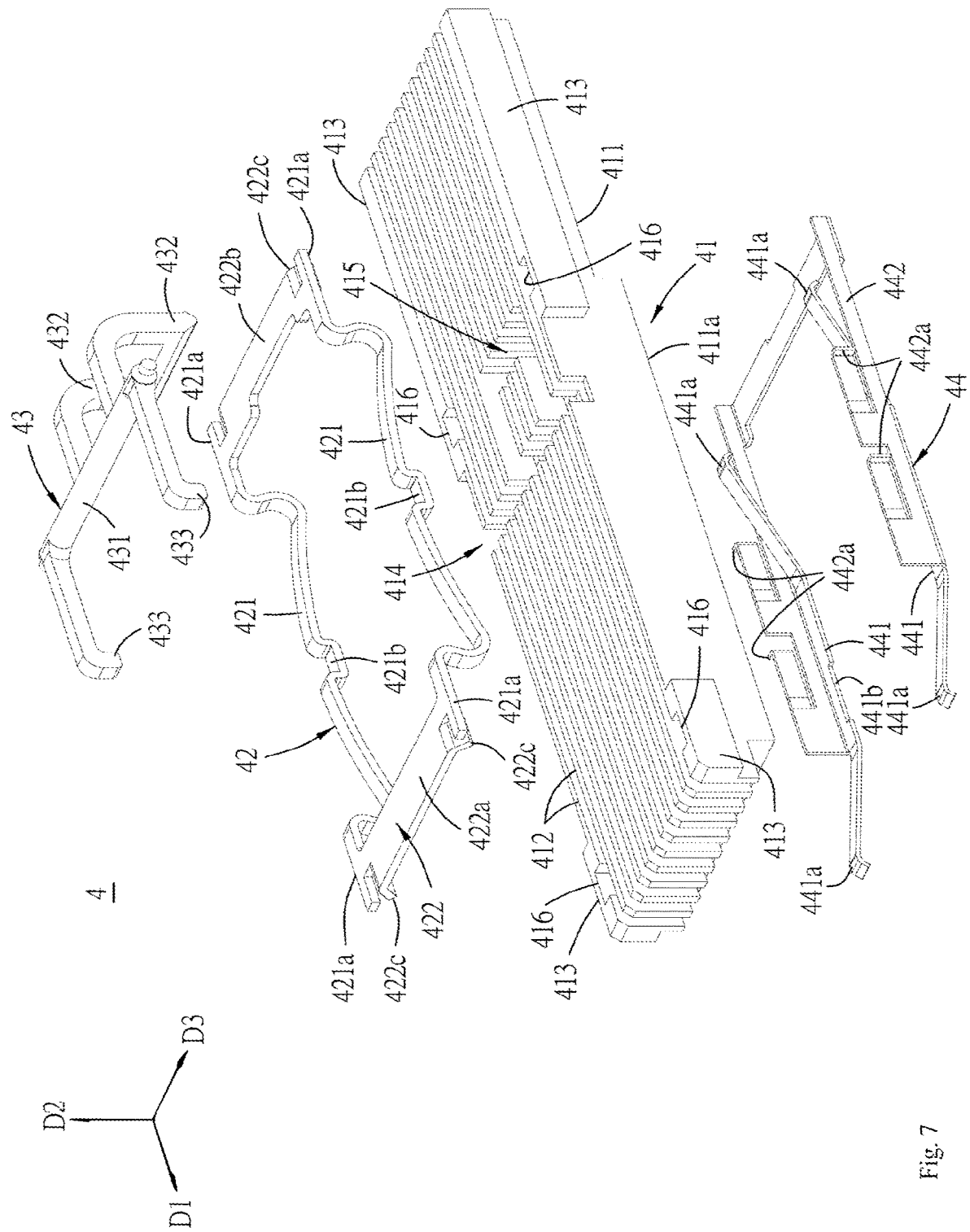
FIG. 7 is a perspective exploded view of the upper heat sink module of the first embodiment.
Figure 8:
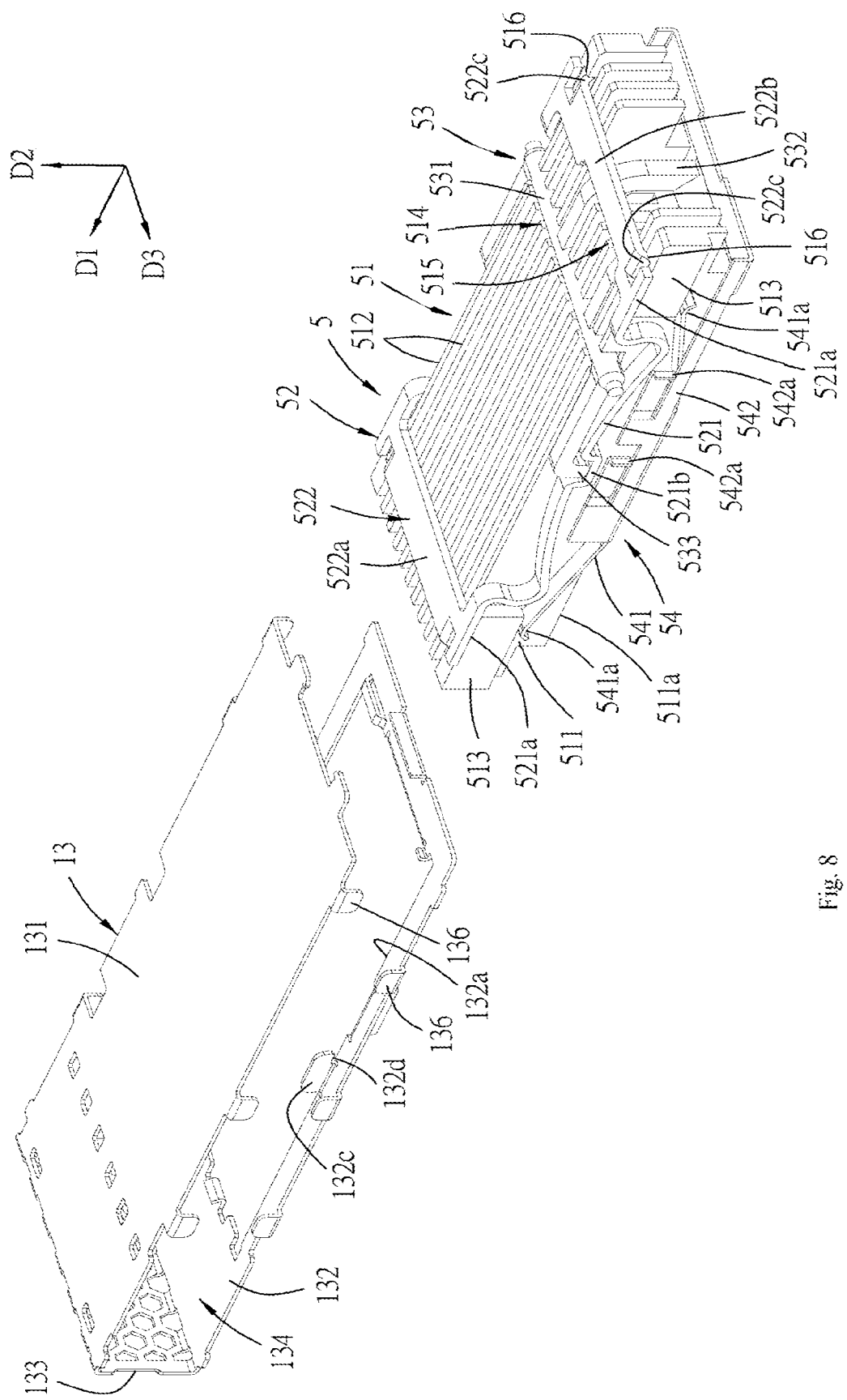
FIG. 8 is a perspective exploded view of a lower heat sink bracket and a lower heat sink module of the first embodiment.
Figure 9:
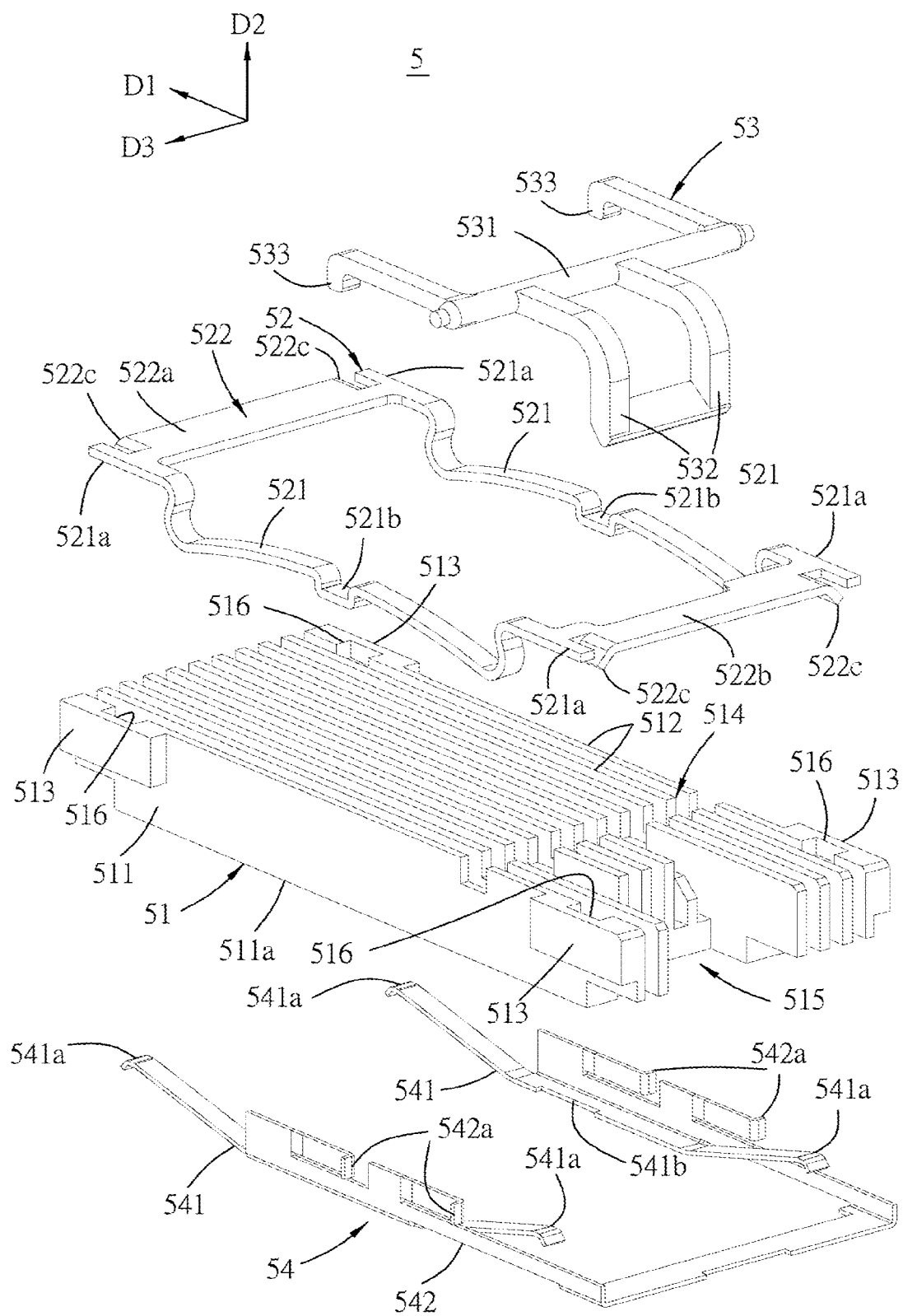
FIG. 9 is a perspective exploded view of the lower heat sink module of the first embodiment.
Figure 10:
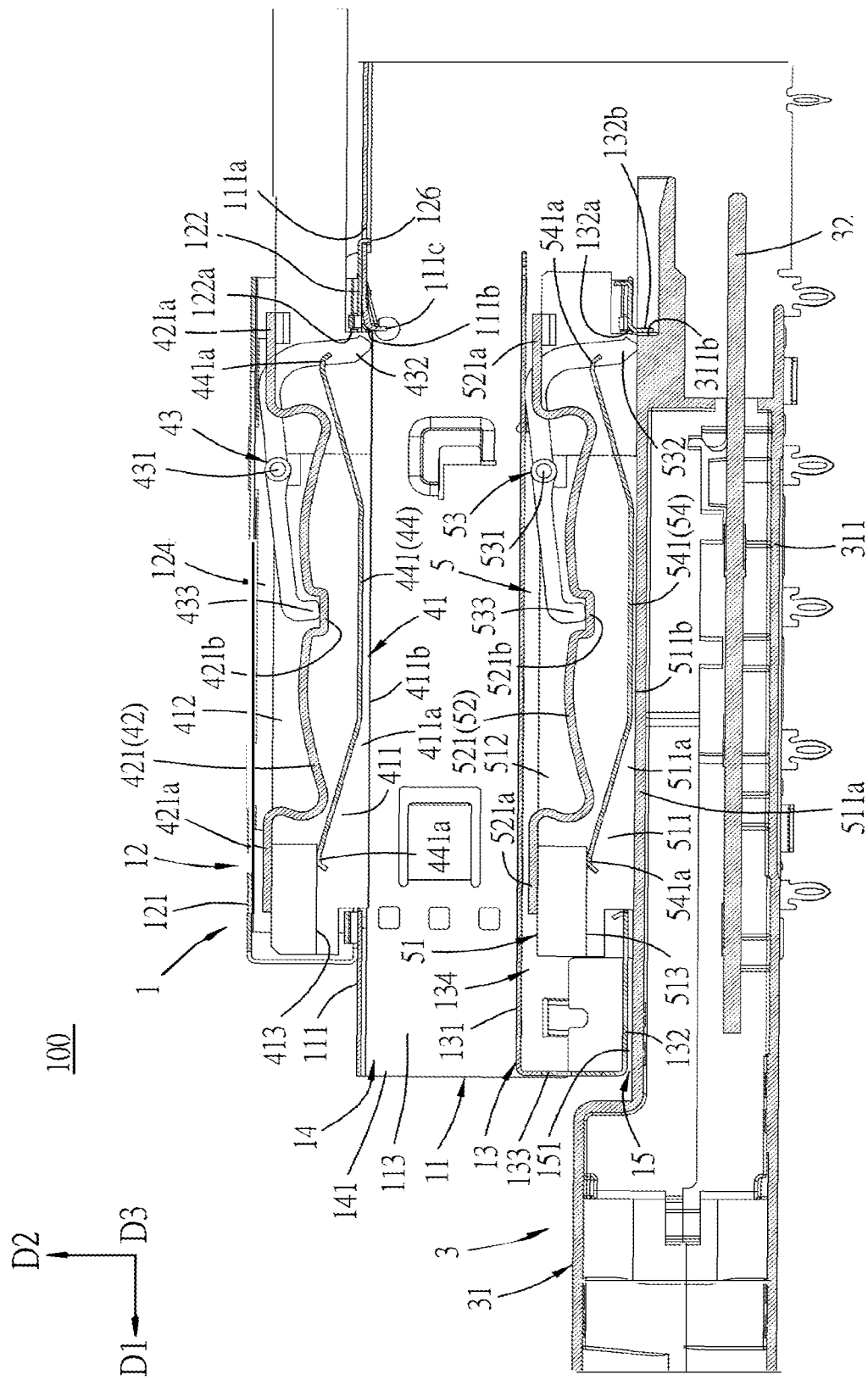
FIG. 10 is a partial cross sectional schematic view of the first embodiment, in which the pluggable module of the first embodiment has completely inserted into the guide shielding cage, and in which both the upper heat sink module and the lower heat sink module of the first embodiment are illustrated under a state that the upper heat sink module and the lower heat sink module each are acted by the pluggable module.

As shown in FIG. 4, when the pluggable module 3 has not completely inserted into the insertion space (the upper insertion space 14 or the lower insertion space 15) such that the pushed end 432(532) of the lever member 43(53) is not subjected to be pushed by an external force generated from the pluggable module 3, the supporting elastic member 441(541) upwardly supports the heat dissipating member 41(51) to make the heat dissipating member 41(51) positioned in the releasing position, and the heat dissipating member 41(51) acts to the lever member 43(53) via the pressure applying elastic member 421(521) to make the pushed end 432(532) of the lever member 43(53) enter into the insertion space (the upper insertion space 14 or the lower insertion space 15); as shown in FIG. 10, when the pluggable module 3 has completely inserted into the insertion space (the upper insertion space 14 or the lower insertion space 15) and the pushed end 432(532) of the lever member 43(53) is subjected to be pushed rearwardly by an external force generated by the aligning structure 311b of the pluggable module 3 so that the lever member 43(53) is rotated, the pressure applying end 433(533) of the lever member 43(53) downwardly applies a pressure to the pressure applying elastic member 421(521) to make the pressure applying elastic member 421(521) downwardly push the heat dissipating member 41(51) to the acting position where the thermal coupling portion 411a(511a) can contact the pluggable module 3, and make the heat dissipating member 41(51) downwardly compress the supporting elastic member 441(541). The compressed the supporting elastic member 441(541) can provide a restoring force which makes the heat dissipating member 41(51) restore to the releasing position when the external force is removed, so when the pluggable module 3 withdraws from the insertion space (the upper insertion space 14 or the lower insertion space 15), the supporting elastic member 441(541) can upwardly push the heat dissipating member 41(51) and make the heat dissipating member 41(51) restore to the releasing position, and make the pushed end 432(532) of the lever member 43(53) again enter into the insertion space (the upper insertion space 14 or the lower insertion space 15).

Figure 11:
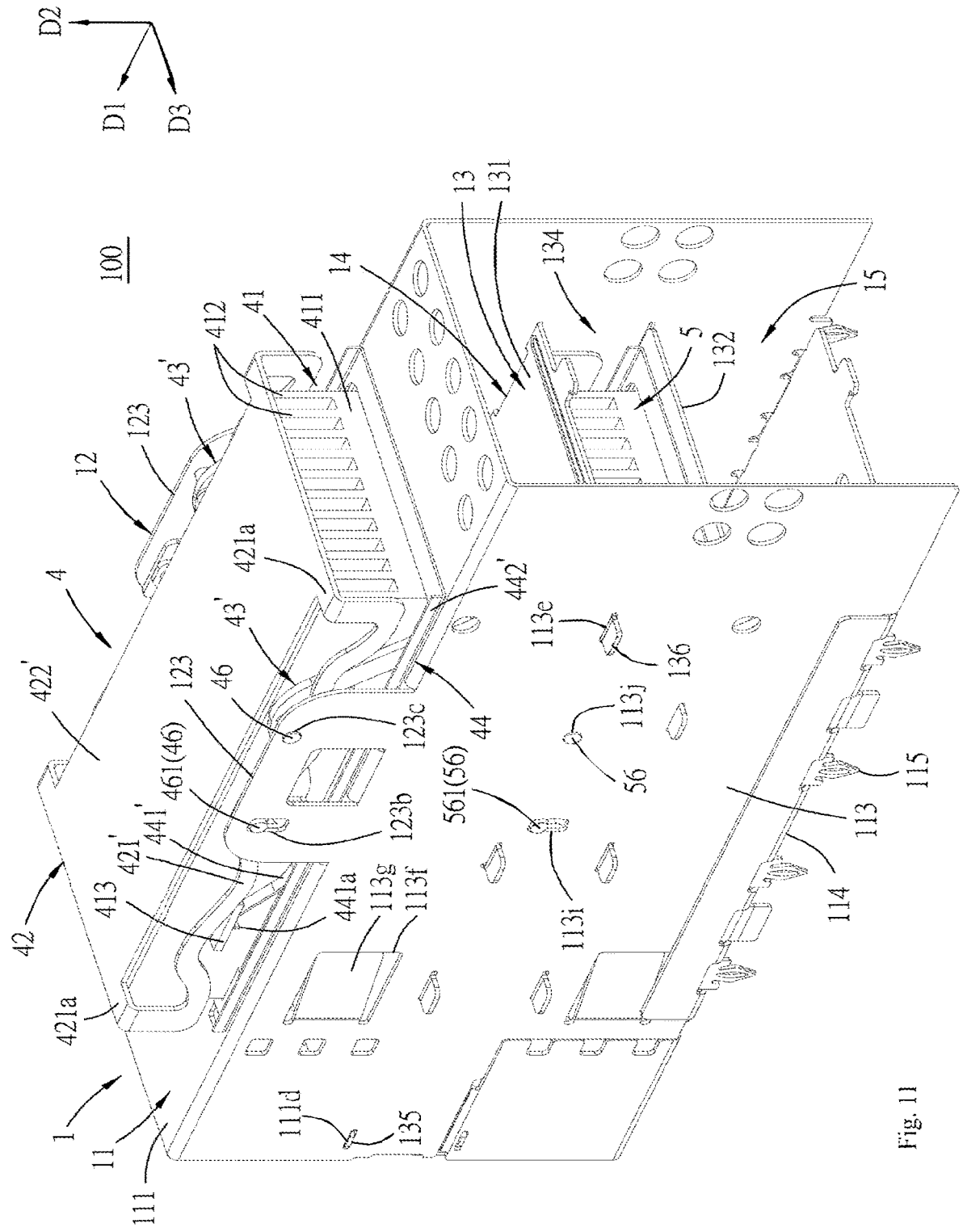
FIG. 11 is a partially perspective view of a second embodiment of the connector assembly of the present disclosure.
Figure 12:
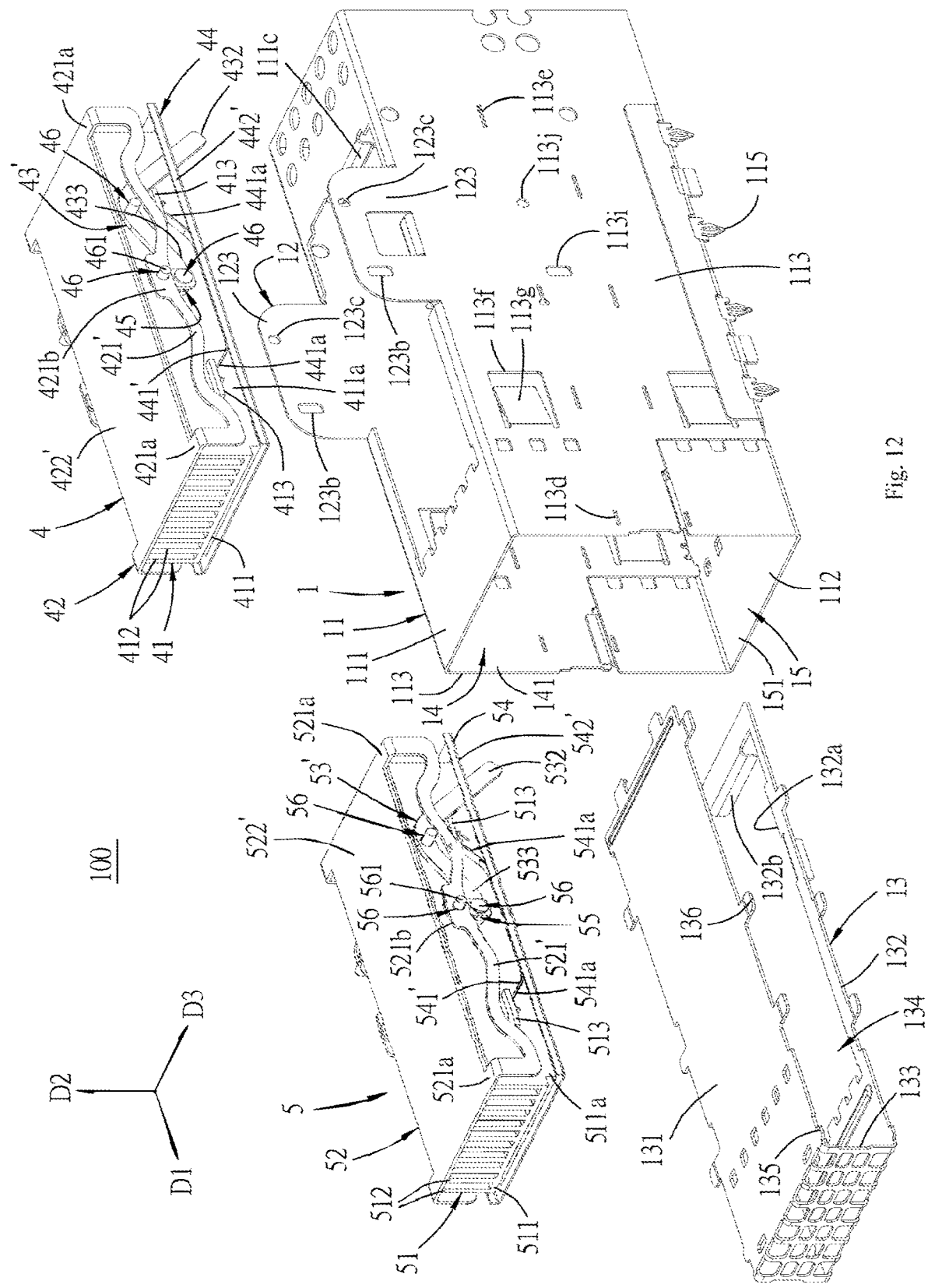
FIG. 12 is a partial perspective exploded view of the second embodiment.
Figure 13:
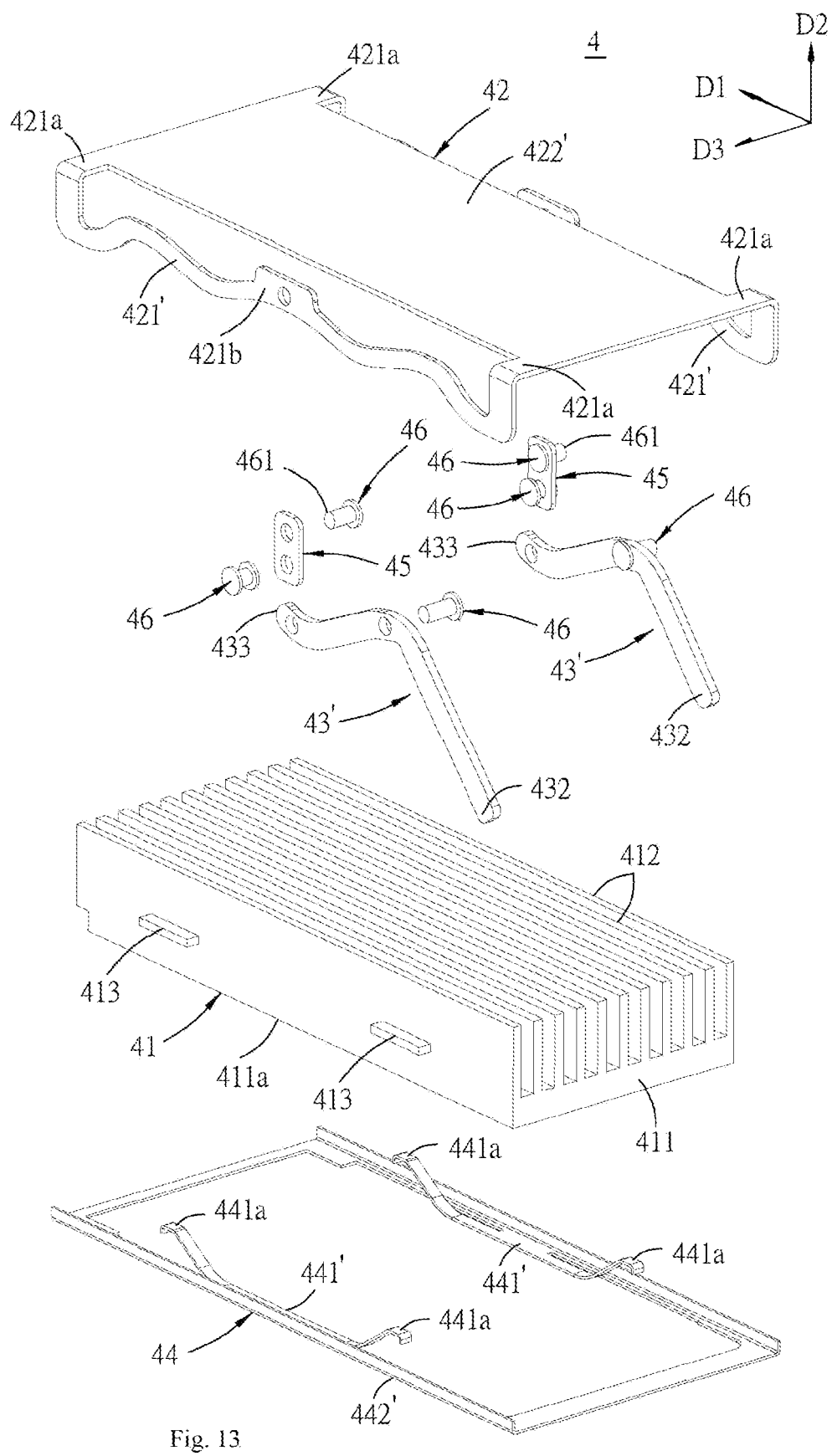
FIG. 13 is a perspective exploded view of an upper heat sink module of the second embodiment.
Figure 14:
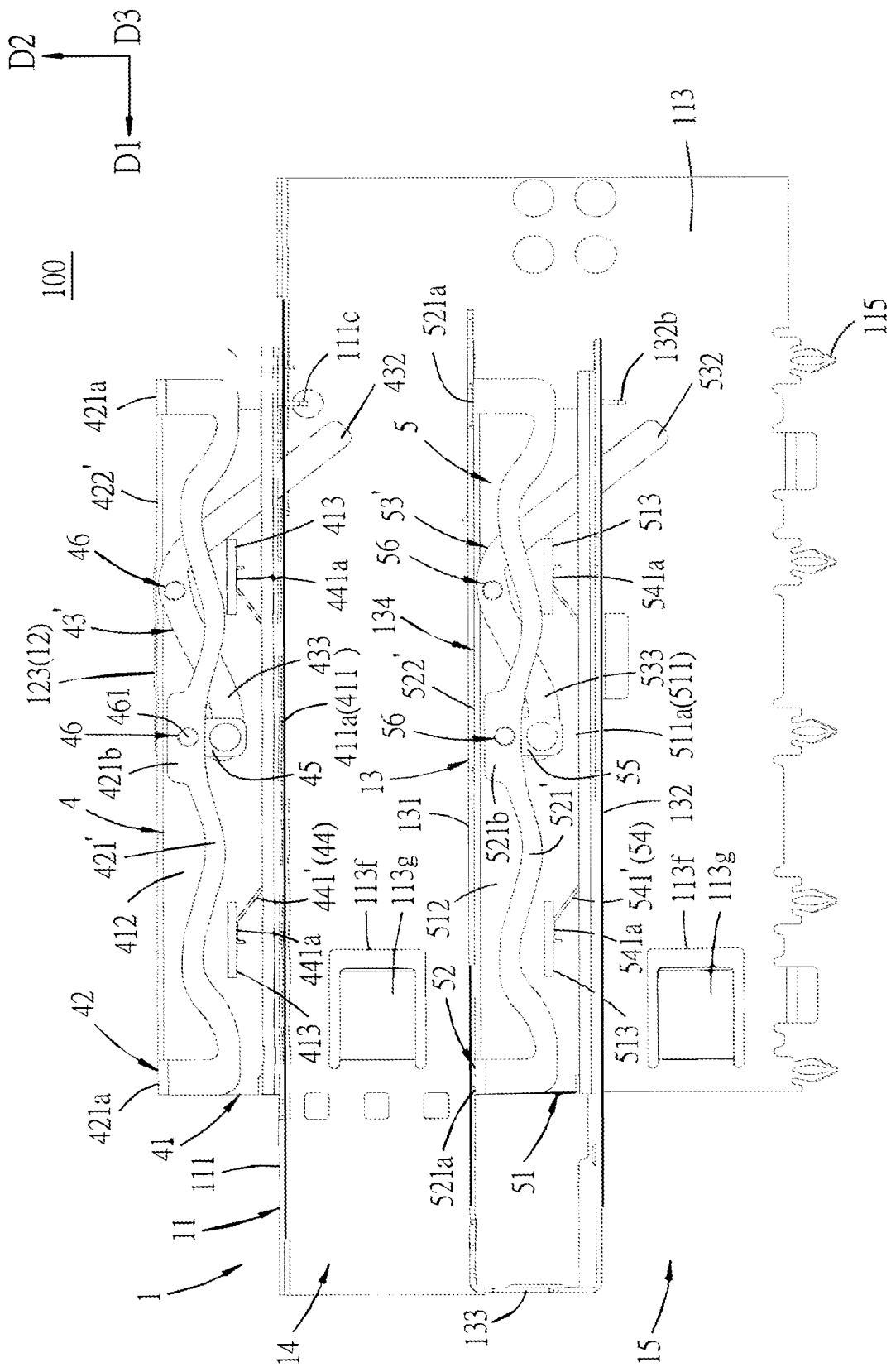
FIG. 14 is a schematic partial side view of the second embodiment.

Referring to FIG. 11 and FIG. 14, a second embodiment of the connector assembly 100 of the present disclosure differs from the first embodiment in that, the two side walls 123 of the upper heat sink bracket 12 of the guide shielding cage 1 are integrally constructed to a left side and a right side of the top wall 111 of the cage body 11, are coplanar with the two side walls 113 respectively and extend out of the top wall 111. The number of the lever member 43' of the upper heat sink module 4 is two and the two lever members 43' are respectively positioned at two side faces of the heat dissipating member 41, the number of the lever member 53' of the lower heat sink module 5 is two and the two lever members 53' are respectively positioned at two side faces of the heat dissipating member 51, each lever member 43'(53') has one pushed end 432(532) and one pressure applying end 433(533), the two pressure applying ends 433(533) of the two lever members 43'(53') are positioned below the two lever acting portions 421b(521b) of the two pressure applying elastic members 421'(521') respectively, and, a connecting bar 45(55) is connected between each pressure applying end 433(533) and the corresponding lever acting portion 421b(521b) by means of a pivoting connection manner, the pressure applying end 433(533) can downwardly apply a pressure to the corresponding lever acting portion 421b (521b) via the connecting bar 45(55). The side wall 123 of the upper heat sink bracket 12 of the guide shielding cage 1 and the side wall 113 of the cage body 11 each formed with a guiding groove 123b(113i) which extends in the up-down direction and corresponds to the upper heat sink module 4 or the lower heat sink module 5, the pressure applying elastic member 421'(521') is provided with a guiding pin 461(561) which is correspondingly received in the guiding groove 123b(113i) and can slide in the up-down direction, the pressure applying elastic member 421'(521'), the connecting bar 45(55), the lever member 43'(53') and the pivoting hole 123c(113j) of the guide shielding cage 1 are pivotally connected via pivoting bars 46(56), and the guiding pin 461(561) is formed to extend outwardly from the pivoting bar 46(56) which is pivoted between the pressure applying elastic member 421'(521') and the connecting bar 45(55).

In addition, the heat dissipating member acting portions 421a(521a) of the two pressure applying elastic members 421' (521') directly act on the heat dissipating fins 412(512)

which are positioned at the left side face and the right side face of the heat dissipating member 41(51), and, the upper frame portion 422'(522') connected between the two pressure applying elastic members 421' (521') is not divided into the front frame 422a(522a) and the rear frame 422b(522b) (see FIG. 7 and FIG. 9) but is constructed as a complete plate body. Moreover, the end frame portion 442'(542') connected between the two supporting elastic members 441'(541') is are a rectangular frame body structure, and the supporting framework 44 of the upper heat sink module 4 which is constituted together by the two supporting elastic members 441' and the end frame portion 442' is interposed between the acting protrusions 413 of the heat dissipating member 41 and the top wall 111 of the cage body 11 of the guide shielding cage 1, the supporting framework 54 of the lower heat sink module 5 which is constituted together by the two supporting elastic members 541' and the end frame portion 542' is interposed between the acting protrusions 513 of the heat dissipating member 51 and the lower wall 132 of the lower heat sink bracket 13.

In conclusion, in the present disclosure, with the pressure applying elastic members 421(521) (and the supporting elastic member 441(541)) provided at the side faces of the heat dissipating member 41(51) respectively, a volume occupied by the heat dissipating member 41(51) is reduced, in addition, the pressure applying elastic members 421(521) and the supporting elastic members 441(541) as individually independent elements respectively directly act to the heat dissipating member 41(51) so as to apply elastic forces in different directions to the heat dissipating member 41(51), thereby making the heat dissipating member 41(51) more balanced and stable when the heat dissipating member 41(51) is moved. Furthermore, by that the two pressure applying elastic members 421(521) and the two supporting elastic members 441(541) are respectively provided at the two side faces of the heat dissipating member 41(51), and each pressure applying elastic member 421(521) and each supporting elastic member 441(541) each have at least front and rear force applying points (or supporting points) with respect to the heat dissipating member 41(51), which can make the movement of the heat dissipating member 41(51) more balanced and stable.

However, the above description is only for the embodiments of the present disclosure and it is not intended to limit the implementing scope of the present disclosure, and the simple equivalent changes and modifications made according to the claims and the contents of the specification are still included in the scope of the present disclosure.

What is claimed is:

1. A connector assembly comprising:
   a guide shielding cage comprising a cage body and an upper heat sink bracket, the cage body comprising a upper insertion space, a top wall of the cage body comprising an upper window which is communicated to the upper insertion space, the upper heat sink bracket is assembled to the top wall of the cage body, the upper heat sink bracket comprising an interior receiving space, a lower wall of the upper heat sink bracket is formed with a corresponding window which corresponds to the upper window; and
   an upper heat sink module in the interior receiving space of the upper heat sink bracket, the upper heat sink module comprising a heat dissipating member, the heat dissipating member being capable of moving between a releasing position which is higher relative to the upper insertion space and an acting position which is lower relative to the upper insertion space, wherein
   the cage body further comprises integrated fixing pieces positioned at two sides of the top wall of the cage body and extending upwardly from the top wall of the cage body,
   the lower wall of the upper heat sink bracket engages with the integrated fixing pieces of the cage body, and
   the upper heat sink bracket further comprises a latching piece which extends from the lower wall of the upper heat sink bracket and latches into the top wall of the cage body.

2. The connector assembly of claim 1, wherein the upper heat sink bracket further comprises two insertion pieces which respectively extend downwardly from two side walls of the upper heat sink bracket and correspondingly engage with two side walls of the cage body.

3. The connector assembly of claim 2, wherein
   each side wall among the two side walls of the cage body comprises an insertion groove, and
   the two insertion pieces correspondingly insert into the insertion grooves.

4. The connector assembly of claim 3, wherein
   the two insertion pieces respectively extend downwardly and rearwardly from the two side walls of the upper heat sink bracket and correspondingly rearwardly insert into the insertion grooves, and
   the latching piece extends rearwardly and downwardly from a rear end of the lower wall of the upper heat sink bracket.

5. The connector assembly of claim 1, wherein
   each integrated fixing piece among the integrated fixing pieces comprises a fixing groove,
   the lower wall of the upper heat sink bracket is snapped into the fixing grooves of the integrated fixing pieces of the cage body,
   the top wall of the cage body further comprises a latching groove, and
   the latching piece extends rearwardly from the lower wall of the upper heat sink bracket and correspondingly latches into the latching groove.

6. The connector assembly of claim 5, wherein
   each fixing groove of the integrated fixing pieces opens forwardly,
   each insertion groove opens forwardly, and
   the latching groove is positioned behind the upper window of the cage body.

7. The connector assembly of claim 6, wherein
   the lower wall of the upper heat sink bracket comprises slits,
   the integrated fixing pieces pass through the slits, and
   a part of the lower wall positioned in front of the slits is snapped into the fixing grooves of the integrated fixing pieces of the cage body.

8. The connector assembly of claim 1, wherein a lower portion of two sides of the upper heat sink bracket comprise side stop pieces which extend downwardly and abut against two side walls of the cage body.

9. A connector assembly comprising:
   a cage body comprising an upper insertion space, a top wall of the cage body comprising an upper window which is communicated to the upper insertion space;
   an upper heat sink bracket assembled over the top wall of the cage body, a lower wall of the upper heat sink bracket comprising a corresponding window which corresponds to the upper window of the top wall of the cage body; and an upper heat sink module comprising a heat dissipating member in the upper heat sink bracket, wherein
the cage body further comprises integrated fixing pieces positioned at two sides of the top wall of the cage body and extending upwardly from the top wall of the cage body,
the lower wall of the upper heat sink bracket engages with the integrated fixing pieces of the cage body, and
the upper heat sink bracket further comprises a latching piece which extends from the lower wall and latches into the top wall of the cage body.

10. The connector assembly of claim 9, wherein the heat dissipating member is capable of moving between a releasing position which is higher relative to the upper insertion space and an acting position which is lower relative to the upper insertion space.

11. The connector assembly of claim 9, wherein
the top wall of the cage body further comprises a latching groove,
the latching groove is positioned behind the upper window of the cage body, and
the latching piece extends rearwardly and downwardly from a rear end of the lower wall of the upper heat sink bracket and latches into the latching groove.

12. The connector assembly of claim 9, wherein
side walls of the cage body comprise insertion grooves, and
the upper heat sink bracket further comprises two insertion pieces which insert into the insertion grooves.

13. The connector assembly of claim 12, wherein
the two insertion pieces respectively extend downwardly and rearwardly from two side walls of the upper heat sink bracket and correspondingly rearwardly insert into the insertion grooves, and
the latching piece extends rearwardly and downwardly from a rear end of the lower wall of the upper heat sink bracket.

14. The connector assembly of claim 9, wherein
the lower wall of the upper heat sink bracket comprises slits, and
the integrated fixing pieces pass through the slits respectively.

15. The connector assembly of claim 14, wherein
each integrated fixing piece among the integrated fixing pieces comprises a fixing groove, and
a part of the lower wall positioned in front of the slits is snapped into the fixing grooves of the integrated fixing pieces of the cage body.

16. The connector assembly of claim 9, wherein a lower portion of two sides of the upper heat sink bracket comprises side stop pieces which extend downwardly and abut against two side walls of the cage body.

17. The connector assembly of claim 9, wherein
the upper heat sink module further comprises a pressure applying elastic member, and
the pressure applying elastic member downwardly pushes the heat dissipating member to an acting position.

18. The connector assembly of claim 9, wherein
the upper heat sink module further comprises a pressure applying elastic member and a supporting elastic member,
the supporting elastic member upwardly and elastically supports the heat dissipating member, and
the pressure applying elastic member downwardly pushes the heat dissipating member to an acting position and makes the heat dissipating member downwardly compress the supporting elastic member.

19. A connector assembly comprising:
a cage body comprising an upper insertion space, a top wall of the cage body comprising an upper window which is communicated to the upper insertion space;
an upper heat sink bracket over the top wall of the cage body; and
an upper heat sink module in the upper heat sink bracket, the upper heat sink module comprising a heat dissipating member, the heat dissipating member being capable of moving between a releasing position which is higher relative to the upper insertion space and an acting position which is lower relative to the upper insertion space, wherein
the cage body further comprises integrated fixing pieces positioned at two sides of the top wall of the cage body and extending upwardly from the top wall of the cage body,
the lower wall of the upper heat sink bracket engages with the integrated fixing pieces of the cage body, and
the upper heat sink bracket further comprises a latching piece which extends from the lower wall and latches into the top wall of the cage body.

20. The connector assembly of claim 19, wherein
the upper heat sink module further comprises a pressure applying elastic member and a supporting elastic member,
the supporting elastic member upwardly and elastically supports the heat dissipating member, and
the pressure applying elastic member downwardly pushes the heat dissipating member to the acting position and makes the heat dissipating member downwardly compress the supporting elastic member.

* * * * *